US007074706B2

United States Patent
Aoyama et al.

(10) Patent No.: US 7,074,706 B2
(45) Date of Patent: Jul. 11, 2006

(54) SEMICONDUCTOR DEVICE AND WIRING FORMING METHOD IN SEMICONDUCTOR DEVICE

(75) Inventors: Junichi Aoyama, Kanagawa (JP); Toshio Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/112,538

(22) Filed: Apr. 22, 2005

(65) Prior Publication Data

US 2005/0191841 A1 Sep. 1, 2005

Related U.S. Application Data

(60) Continuation of application No. 10/646,508, filed on Aug. 22, 2003, now Pat. No. 6,927,158, which is a division of application No. 10/107,568, filed on Mar. 27, 2002, now Pat. No. 6,765,297.

(30) Foreign Application Priority Data

Mar. 27, 2001 (JP) .......................... P2001-090292

(51) Int. Cl.
*H01L 21/4763* (2006.01)
(52) U.S. Cl. .................... 438/619; 438/622; 438/624; 438/618; 438/778

(58) Field of Classification Search ................ 438/618, 438/619, 622, 624, 778
See application file for complete search history.

(56) References Cited

U.S. PATENT DOCUMENTS

| 5,641,712 | A   | 6/1997  | Grivna et al. |           |
|-----------|-----|---------|---------------|-----------|
| 6,016,000 | A   | 1/2000  | Moslehi       |           |
| 6,124,198 | A   | 9/2000  | Moslehi       |           |
| 6,255,712 | B1  | 7/2001  | Clevenger et al. |        |
| 6,284,675 | B1* | 9/2001  | Jin et al.    | 438/778   |
| 6,413,852 | B1* | 7/2002  | Grill et al.  | 438/619   |
| 6,472,333 | B1  | 10/2002 | Xia et al.    |           |
| 6,524,429 | B1  | 2/2003  | Nogami et al. |           |
| 6,765,297 | B1  | 7/2004  | Aoyama et al. |           |

* cited by examiner

*Primary Examiner*—Bradley K. Smith
*Assistant Examiner*—Douglas M. Menz
(74) *Attorney, Agent, or Firm*—Sonnenschein Nath & Rosenthal LLP

(57) ABSTRACT

The present invention provides a semiconductor device in which a problem such as a thermal diffusion defect in a hollow wiring technique can be solved. In the semiconductor device, a gap is formed between wirings formed on a substrate, and the gap is filled with a gas having a thermal conductivity equal to or higher than three times that of air at 0° C.

3 Claims, 10 Drawing Sheets

SEMICONDUCTOR DEVICE AND WIRING FORMING METHOD IN SEMICONDUCTOR DEVICE

CROSS REFERENCES TO RELATED APPLICATIONS

This application is a continuation application of U.S. application Ser. No. 10/646,508, filed Aug. 22, 2003 now U.S. Pat. No. 6,927,158, which is a divisional of U.S. application Ser. No. 10/107,568 filed Mar. 27, 2002 now U.S. Pat. No. 6,765,297, which is incorporated herein by reference to the extent permitted by law.

BACKGROUND OF THE INVENTION

1. Field of the Invention

The present invention relates to a semiconductor device and a wiring forming method in a semiconductor device and, more particularly to a semiconductor device in which a gap exists between wirings, and a wiring forming method in a semiconductor device.

2. Description of Related Art

In recent years, in a semiconductor device, multiple-layer wiring and miniaturization have been greatly advanced for the sake of higher performance. In a case of such a semiconductor device, as the miniaturization is advanced, parasitic capacitance between the wirings is increased, which leads to a serious problem for the development of a higher speed of a semiconductor device.

As a unit for reducing a drop in the parasitic capacitance, a technique of forming a gap between a plurality of wirings formed on a substrate is known (for convenience, it is referred to as a hollow wiring technique). The outline of an example of this hollow wiring technique will be described below with reference to sectional views of insulation layers of FIGS. 9A to 10B and the like, on the basis of a technique disclosed in Japanese Patent Application Laid-Open JP-A-Heisei, 2-240947.

[Process 10]

At first, a known transistor element (for example, MOS type FET) is formed on a semiconductor substrate. Then, a first insulation layer 110 is formed on the entire surface by using a CVD method. After that, for example, a lithography technique and a dry etching technique are used to form openings on the first insulation layer 110. Then, for example, a sputtering technique and the dry etching technique are used to fill wiring material into the opening. Also, first wirings 111 are formed on the first insulation layer 110. This situation is shown in FIGS. 9A and 9B. However, the illustrations of the semiconductor substrate, the transistor element and the openings are omitted in FIGS. 9A to 10B. Also, FIGS. 9A and 9C and FIG. 10A are the views when the first insulation layer 110 and the like are cut on a plane vertical to a direction orthogonal to a direction in which the first wiring 111 is extended, and FIGS. 9B and 9D and FIG. 10B are the views when the first insulation layer 110 and the like are cut on a plane vertical to a direction parallel to the direction in which the first wiring 111 is extended.

[Process-20]

After that, after a second insulation layer 112 is formed on the entire surface by using the CVD method, planarization is performed on a surface of the second insulation layer 112. Next, the lithography technique and the dry etching technique are used to form the openings on the second insulation layer 112 above the first wiring 111. Next, for example, the sputtering technique and the dry etching technique are used to fill the wiring material into the openings. Also, second wirings 113 are formed on the second insulation layer 112. This situation is shown in FIGS. 9C and 9D.

[Process-30]

Next, the second wiring 113 is used as an etching mask, and the second insulation layer 112 is etched. Accordingly, gaps 114 can be formed between the first wirings 111 and between the second wirings 113. This situation is shown in FIGS. 10A and 10B. After that, thin insulation layer is formed on the entire surface, and the wiring structure is completed.

Also, a semiconductor device having a structure in which the gap between a plurality of wirings formed on the substrate is vacuum is also well known.

Such a hollow wiring technique is effective means for dropping the parasitic capacitance between the wirings. However, since the gap is filled with air or it is vacuum, this results in a problem that the thermal diffusion in the gap is poor. That is, the heat generation when the semiconductor device is operated causes the wiring to be deformed or cut away, and also brings about drop in reliability and occurrence of a trouble in the semiconductor device.

Therefore, the present invention provides a semiconductor device, in which the problem such as the defect of the thermal diffusion in the hollow wiring technique can be solved, and a wiring formation method in a semiconductor device.

SUMMARY OF THE INVENTION

A semiconductor device of the present invention to solve the above-mentioned problem is characterized in that a gap is formed between wirings on a substrate, and the gap is filled with gas having a thermal conductivity equal to or higher than three times that of air at 0° C.

By the way, in the following explanation, there may be a case where the gap, which is filled with the gas having the thermal conductivity (at 0° C.) equal to or higher than three times the thermal conductivity ($2.4 \times 10^{-2}$ W $(m^{-1})$ $(K^{-1})$) of the air at 0° C. is filled between the wirings, is referred to as the wiring structure in the present invention. Also, there may be a case where the gas having the thermal conductivity (at 0° C.) equal to or higher than three times that of the air at 0° C. is referred to as a highly thermally conductive gas, for the convenience.

In the semiconductor device of the present invention, preferably, one or more gas impermeable films through which the highly thermally conductive gas cannot be permeated are formed on the wiring and above the gap. Or, preferably, the lamination structure comprised of one or more gas permeable films, through which the highly thermally conductive gas can be permeated, and the gas impermeable films, through which the highly thermally conductive gas cannot be permeated, are formed on the wiring and above the gap. Here, silicon nitride (SiN) can be exemplified as the material constituting the gas impermeable film. By the way, preferably, the gas impermeable film made of the silicon nitride is formed by a plasma CVD method in the condition that the formed gas impermeable film has a compression stress. Also, the material constituting the gas permeable film can include the material constituting the gas permeable film in the explanation of a wiring forming method in a semiconductor device according to a first or third embodiment of the present invention, which will be described later.

A wiring forming method in a semiconductor device according to a first embodiment of the present invention includes the steps of:

(A) forming at least one wiring and a filling layer filled between the wirings, on a substrate;

(B) forming a gas permeable film on the wiring and the filling layer;

(C) removing the filling layer through the gas permeable film so as to form a gap between the wirings;

(D) filling a gas having a thermal conductivity equal to or higher than three times that of air at 0° C. through the gas permeable film into the gap; and (E) forming a gas impermeable film on the gas permeable film.

In the wiring forming method in the semiconductor device according to the first embodiment of the present invention, the step (A) of forming the wiring and the filling layer filled between the wirings on the substrate can be comprised of, for example, the steps of forming the wiring on the substrate by using the known method; forming the filling layer on the entire surface by using a CVD method, a spin coating method, a sputtering method and the like; and then flattering the filling layer. Alternatively, it can be comprised of the steps of forming the filling layer on the substrate; forming a concave portion (for example, a groove) on the portion of the filling layer on which the wiring is formed; forming a wiring material layer on the entire surface including the concave portion by using an evaporating method, a sputtering method, a CVD method, a plating method and the like; selectively removing the wiring material layer on the filling layer by using a chemically mechanically polishing method (CMP method) and an etching-back method; and thereby filling the wiring material layer into the concave portion, and accordingly obtaining the wiring.

The material constituting the filling layer may be the material that can be removed through the gas permeable film, actually, the material that can be made into gaseous substance by the actions, such as fusion, dissolution, evaporation, vaporization, decomposition, sublimation and the like, or the material that can be etched through the gas permeable film. As such material, ice; alcohol; resist material; carbon; and a so-called foaming material which is used when silica gel or porous silica film is formed can be exemplified.

The wiring forming method in the semiconductor device according to the first embodiment of the present invention can be designed such that the gas permeable film is made of a porous insulation material (for example, an insulation material having a low dielectric constant) and the gas impermeable film can be made of silicon nitride (SiN) or silicon oxide ($SiO_2$). Here, as an example, the insulation material having a low dielectric constant κ may include: non-fluorine system polymer, such as BCB (Benzo-Cyclo-Butene: κ=2.6), poly-aryl-ether (κ=2.6 to 2.8), polyimide (κ=2.9) and the like; fluorine system polymer, such as fluorine addition polyimide (κ=2.7), tetra-fluoro ethylene (κ=2.1 to 1.9), cyclo-perfluoro carbon (κ=2.1), poly-aryl-fluoride ether (κ=2.6), fluorine addition parylene (κ=2.4) and the like; organic SOG (κ=2.7); silicon oxide system xerogel (κ=2.0); nano-porous silica; and amorphous carbon (κ=2.5). The method of forming the gas permeable film may be suitably determined on the basis of the material constituting the gas permeable film. It may include the CVD method, the spin coating method and the sputtering method, as an example. Also, preferably, the gas impermeable film made of the silicon nitride is formed by the plasma CVD method. Moreover, the forming condition having the compression stress is the most effective.

In the wiring forming method in the semiconductor device according to the first embodiment of the present invention, at the step (C), after the filling layer is removed through the gas permeable film, it is preferably set at a state of vacuum (decompression) atmosphere so that the remaining gas remaining in the gap (the gas composed of the material constituting the filling layer, or the decomposition material, the reactant and the like) is removed.

At the step (D) of filling through the gas permeable film into the gap, the highly thermally conductive gas which has a pressure lower than an ambient pressure may be filled, or the highly thermally conductive gas which has a pressure equal to or higher than the ambient pressure may be filled.

A wiring forming method in a semiconductor device according to a second embodiment of the present invention includes the steps of:

(A) forming a plurality of wirings on a substrate; and (B) forming a gas impermeable film on the wirings and above gaps existing between the wirings, in gas atmosphere having a thermal conductivity equal to or higher than three times that of air at 0° C.

In the wiring forming method in the semiconductor device according to the second embodiment of the present invention, preferably, the step (B) of forming the gas impermeable films is actually comprised of the step of laminating the gas impermeable films made of polyimide film on the wiring.

Also, the pressure of the gas atmosphere (the highly thermally conductive gas atmosphere) at the step (B) may be the pressure lower than the ambient pressure or the pressure equal to or higher than the ambient pressure.

A wiring forming method in a semiconductor device according to a third embodiment of the present invention includes the steps of:

(A) forming a plurality of wirings on a substrate;

(B) forming a gas permeable film on the wirings and above gaps existing between the wirings;

(C) filling gas having a thermal conductivity equal to or higher than three times that of air at 0° C. through the gas permeable film into the gap; and (D) forming a gas impermeable film on the gas permeable film.

In the wiring forming method in the semiconductor device according to the third embodiment of the present invention, preferably, the step (B) of forming the gas permeable films is actually comprised of the step of laminating the gas permeable films made of silicon oxide film or low dielectric constant film (the film whose component is a material having a low dielectric constant) on the wiring. Also, the gas impermeable film is preferably composed of silicon nitride (SiN) or silicon oxide ($SiO_2$). By the way, the gas impermeable film made of the silicon nitride is preferably formed by the plasma CVD method. Moreover, the forming condition having the compression stress is the most effective. Depending on a case, preferably, the gas impermeable film is made of polyimide film, and the step (D) of forming the gas impermeable film is comprised of the step of laminating the gas impermeable film made of the polyimide film on the wiring.

Also, at the step (C) of filling the highly thermally conductive gas through the gas permeable film into the gaps, the highly thermally conductive gas atmosphere of the pressure lower than the ambient pressure may be filled or the highly thermally conductive gas of the pressure equal to or higher than the ambient pressure may be filled.

In the semiconductor device of the present invention or the wiring forming method in the semiconductor device according to the first to third embodiments (hereafter, there may be a case that they are collectively referred to as the present invention), preferably, the highly thermally conductive gas is helium gas (a thermal conductivity at 0° C.: $14\times10^{-2}$ W $(m^{-1})$ $(K^{-1})$ or hydrogen gas (a thermal conductivity at 0° C.: $17\times10^{-2}$ W $(m^{-1})$ $(K^{-1})$ More preferably, it may be the helium gas. Preferably, the pressure of the highly thermally conductive gas filled in the gaps is $0.5\times10^5$ Pa to $1.5\times10^5$ Pa. More preferably, it is $0.8\times10^5$ Pa to $1.2\times10^5$ Pa. By the way, the gas may be a mixture gas containing the helium gas, a mixture gas containing the hydrogen gas, or a mixture gas containing the helium gas and the hydrogen gas. If such a mixture gas is used, the rate between the helium gas and the hydrogen gas in the mixture gas may be the rate satisfying the requirement that a thermal conductivity of the mixture gas is a thermal conductivity (at 0° C.) equal to or higher than three times that of air at 0° C. By the way, Ne (a thermal conductivity at 0° C.: $5\times10^{-2}$ W $(m^{-1})$ $(K^{-1})$) can be exemplified as another gas constituting the mixture gas.

The combination of an insulation layer and a connection hole (a contact hole, a via hole or a through hole) formed between the insulation layers can be exemplified as the substrate in the present invention. Under or below the insulation layer, for example, a transistor device and the like are formed, or a low layer wiring is formed. Or, the combination of the insulation layer and an opening formed on the insulation layer can be exemplified. In this case the wiring material is extended from the wiring into the opening to accordingly form the connection hole. Or, the gas impermeable film can be exemplified as the substrate. In this case, the wiring structure of the semiconductor device in the present invention is formed under the gas impermeable film.

The wiring material constituting the wiring in the present invention may include aluminum, aluminum alloy such as Al—Si, Al—Cu, Al—Si—Cu and the like, metal such as tungsten (W), molybdenum (Mo), Copper (Cu), Gold (Au) and the like, alloys of them, various silicides and polysilicon having impurities, as an example. The wiring forming method may include a method of patterning after the formation of the wiring material, or a so-called damascene method such as a single damascene method and a dual damascene method.

In the semiconductor device of the present invention, the wiring has a multiple-layer structure. That is, it may have the structure in which a wiring is formed through a plug made of a wiring material on a wiring (a two-layer wiring structure) or the structure in which the above-mentioned structures are repeated (a multiple-layer wiring structure having a multiple-layer of three layers or more), and a gap may exist between those multiple-layer wiring structures. Or, it may be designed such that the wiring structures of the present invention are laminated. In this case, the gas impermeable film, or a lamination structure of the gas permeable film and the gas impermeable film, and an insulation layer as necessary are formed between the upper wiring structure and the lower wiring structure of the present invention. In this case, the wirings in the respective layers are made of the wiring material, and they are connected through the plug formed in a lamination structure of the insulation layer and the gas impermeable film; a lamination structure of the insulation layer and the gas permeable film; a lamination structure of the insulation layer, the gas permeable film and the gas impermeable film; the gas permeable film; the gas impermeable film; or a lamination structure of the gas permeable film and the gas impermeable film.

By the way, if the semiconductor device having the multiple-layer wiring structure is manufactured, in the case of the wiring forming method in the semiconductor device according to the first embodiment of the present invention, the process for carrying out the step (A) and forming an interlayer insulation layer corresponding to the filling layer on the entire surface and then carrying out the step (A) may be repeated for a desired number of times. In the case of the wiring forming method in the semiconductor device according to the second or third embodiment of the present invention, the process for carrying out the step (A) and forming the interlayer insulation layer on the entire surface and then carrying out the step (A) may be repeated for a desired number of times, and after that, the interlayer insulation layer may be removed. By the way, in this case, the interlayer insulation layer may be etched by using the wiring as an etching layer mask.

Also, if the semiconductor device having a construction in which the wiring structures of the present invention are laminated is manufactured, in the case of the wiring forming method in the semiconductor device according to the first embodiment of the present invention, the steps (A) to (E) may be repeated for a desired number of times; or the steps (D), (E) may be carried out after the steps (A) to (C) are repeated for a desired number of times; or the steps (C), (D) and (E) may be carried out after the steps (A), (B) are repeated for a desired number of times. Also, in the case of the wiring forming method in the semiconductor device according to the second embodiment of the present invention, the steps (A), (B) may be repeated for a desired number of times. Moreover, in the case of the wiring forming method in the semiconductor device according to the third embodiment, the steps (A) to (D) may be repeated for a desired number of times; or the steps (C), (D) may be carried out after the steps (A), (B) are repeated for a desired number of times.

In the present invention, the gap between the wirings is filled with the highly thermally conductive gas having the thermal conductivity equal to or higher than three times that of the air at 0° C. Thus, it is possible to solve the problem in the conventional technique, such as the poor thermal diffusion in the gap.

The material constituting the typical wiring structure that is not the hollow wiring structure may include, for example, aluminum (a thermal conductivity at 0° C.: 233 W $(m^{-1})$ $(K^{-1})$), $SiO_2$ (a thermal conductivity at 0° C.: 1.4 W $(m^{-1})$ $(K^{-1})$) and Si (a thermal conductivity at 0° C.: 156 W $(m^{-1})$ $(K^{-1})$). From the values of the thermal conductivities of the respective materials, it can be considered that the heat generated within such a semiconductor device is not substantially radiated from a chip surface of the semiconductor device and most of the heat is radiated from the side of the silicon semiconductor substrate. Moreover, there is no large mistake even if it is considered that most of the heat is conducted through the connection hole filled with the metallic wiring material (for example, aluminum) without any intervention of the insulation layer existing between the wirings. Thus, in the case of the hollow wiring structure, there may be no problem at a glance since there is little conductance of the heat through the insulation layer even if the gap is filled with air (a thermal conductivity at 0° C.: $2.4\times10^{-2}$ W $(m^{-1})$ $(K^{-1})$) or it is set vacuum.

However, the conductance of the heat through the insulation layer existing between the wirings cannot be ignored from the consideration of the following points. A total area of the connection hole between the upper layer wiring and the lower layer wiring is only 20% of an area occupied by the wirings, even in a case of an installment of a dummy connection hole. Also, an area occupied by the wiring formed on the insulation layer is only about 10% per layer, in the upper layer portion of the multiple-layer wiring. Thus, the total area of the connection hole is only about 2% per layer, in the upper layer portion of the multiple-layer wiring, even in the case of the installation of the dummy connection hole. If a ratio of a calorie radiated through the connection hole to a calorie radiated through the insulation layer existing between the wirings is assumed to be a ratio of a thermal conductivity to an area, the ratio of the calorie radiated through the connection hole to the calorie radiated through the insulation layer existing between the wirings is represented by:

$$233 \times 0.02 : 1.4 \times 0.8 \approx 1 : 0.24 \quad (1)$$

Here, if the hollow wiring structure is employed and the insulation layer existing between the wirings is substituted for the gap filled with the air, a ratio of a calorie radiated through the connection hole to a ratio radiated through the gap is represented by:

$$233 \times 0.02 : 2.4 \times 10^{-2} \times 0.8 \approx 1 : 0.0041 \quad (2)$$

On the other hand, if the wiring structure of the present invention is employed and the helium gas is used as the highly thermally conductive gas, the ratio of the calorie radiated through the connection hole to the calorie radiated through the gap is represented by:

$$233 \times 0.02 : 14 \times 10^{-2} \times 0.8 \approx 1 : 0.024 \quad (3)$$

As mentioned above, in the semiconductor device of the present invention or the wiring forming method in the semiconductor device, the higher thermal diffusion even through the gap can be obtained over the conventional hollow wiring structure in which the gap is filled with the air.

In the present invention, the gap placed between the wirings is filled with the highly thermally conductive gas having the thermal conductivity equal to or higher than three times that of the air at 0° C. Thus, the high thermal diffusion can be obtained even through the gap, as compared with the conventional hollow wiring structure in which the air is filled in the gap. Moreover, if the helium gas or the hydrogen gas is used as the highly thermally conductive gas, since the dielectric constants κ of those gases are very smaller than the dielectric constant of the air, it is possible to attain the further drop in the parasitic capacitance between the wirings. Hence, it is possible to obtain the semiconductor device that has high reliability and also enables high-speed operation.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIGS. 1A to 1C are partially sectional views diagrammatically showing an insulation layer and the like to describe a wiring forming method in a semiconductor device of a first embodiment of the present invention, in which FIG. 1A shows [Process 100], FIG. 1B shows [Process 110], and FIG. 1C shows [Process 120];

FIGS. 2A to 2C are partially sectional views diagrammatically showing an insulation layer and the like to describe the wiring forming method in the semiconductor device of the first embodiment of the present invention, subsequent to FIGS. 1A to 1C, in which FIG. 2A shows [Process 130], FIG. 2B shows [Process 140], and FIG. 2C shows [Process 150];

FIGS. 3A, 3B are partially sectional views diagrammatically showing an insulation layer and the like to describe a wiring forming method in a semiconductor device of a second embodiment of the present invention, in which FIG. 3A shows [Process 200], and FIG. 3B shows [Process 210];

FIGS. 4A to 4C are partially sectional views diagrammatically showing an insulation layer and the like to describe a wiring forming method in a semiconductor device of a third embodiment of the present invention, in which FIG. 4A shows [Process 310], and FIG. 4B and FIG. 4C show subsequent steps to FIG. 4A;

FIGS. 5A to 5C are partially sectional views diagrammatically showing an insulation layer and the like to describe the wiring forming method in the semiconductor device of the third embodiment of the present invention, subsequent to FIGS. 4A to 4C, in which FIG. 5A shows [Process 320], and FIG. 5B and FIG. 5C show subsequent steps to FIG. 5A;

FIGS. 6A, 6B are partially sectional views diagrammatically showing an insulation layer and the like to describe a wiring forming method in a semiconductor device of a fourth embodiment of the present invention, in which FIG. 6A shows [Process 400], and FIG. 6B shows [Process 410];

FIGS. 7A to 7C are partially sectional views diagrammatically showing an insulation layer and the like to describe a wiring forming method in a semiconductor device of a fifth embodiment of the present invention, in which FIG. 7A shows [Process 500], FIG. 7B shows [Process 510], and FIG. 7C shows [Process 520];

FIGS. 9A, 9B, 9C and 9D are partially sectional views diagrammatically showing an insulation layer and the like to describe a conventional method of manufacturing a semiconductor device having a hollow wiring structure, in which FIG. 9A shows [Process 10], FIG. 9B shows a step subsequent to FIG. 9A, FIG. 9C shows [Process 20], and FIG. 9D shows a step subsequent to FIG. 9C; and FIGS. 10A, 10B are partially sectional views diagrammatically showing an insulation layer and the like to describe the conventional method of manufacturing the semiconductor device having the hollow wiring structure, subsequent to FIG. 9A to 9D, in which FIG. 10A shows [Process 30], and FIG. 10B shows a subsequent step to FIG. 10A.

DETAILED DESCRIPTION OF THE PREFERRED EMBODIMENTS

The present invention will be described below on the basis of an embodiment of the present invention (hereafter, abbreviated as an embodiment) with reference to the attached drawings.

(First Embodiment)

A first embodiment relates to a semiconductor device of the present invention, and a wiring forming method in the semiconductor device according to the first embodiment of the present invention. In the first embodiment, helium gas is used as a highly thermally conductive gas. Also, a substrate is an insulation layer formed on a silicon semiconductor substrate on which a transistor element such as MOS type FET and the like are formed. A filling layer is made of ice, a gas permeable film is made of silicon oxide, and a gas impermeable film is made of silicon nitride. The semiconductor device and the wiring forming method in the first embodiment will be described below with reference to FIGS. 1A to 2C that are the partially sectional views diagrammatically showing the insulation layer and the like.

[Process-100]

Figure 1A:
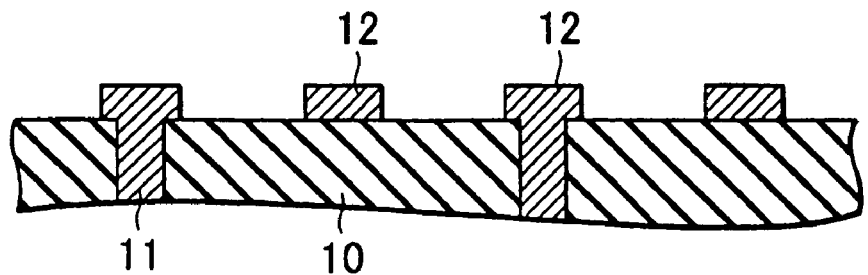

At first, a known transistor device (for example, the MOS type FET) is formed on a semiconductor substrate. Then, the CVD method is used to form an insulation layer (hereafter, referred as a base insulation layer) 10 on the entire surface. After that, the lithography technique and the dry etching technique are used to form openings on the base insulation layer 10. Then, for example, the sputtering technique and the dry etching technique are used to fill wiring material (for example, aluminum alloy) into the opening. A contact plug 11 is formed in the opening. Also, a wiring 12 is formed on the base insulation layer 10 corresponding to the substrate. Accordingly, the structure as shown in FIG. 1A can be obtained. By the way, the illustrations of the semiconductor substrate and the transistor device are omitted in the following drawings. Also, they are the views when the base insulation layer 10 and the like are cut on a plane vertical to a direction orthogonal to a direction in which the first wiring 12 is extended.

[Process-110]

Figure 1B:
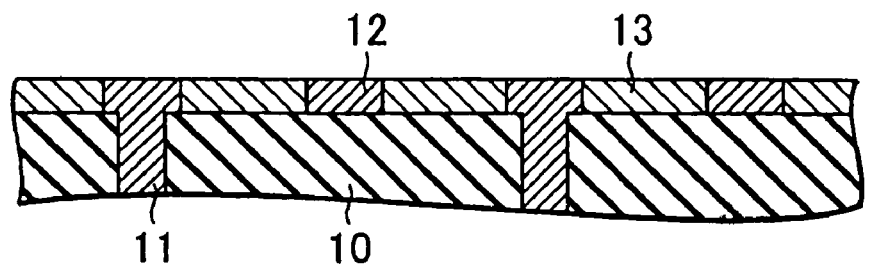

Next, for example, by using a spin coating method, while the semiconductor substrate is cooled to 0° C. or less, for example, water is dropped to accordingly form an ice film for covering the wiring 12 and the base insulation layer 10. After that, the ice film is selectively removed while alcohol is fed, by using a CMP method. Thus, as shown in FIG. 1B, a wiring 12 and a filling layer 13 filled between the wirings 12 can be formed on the base insulation layer 10 corresponding to the substrate. By the way, instead of the CMP method, it is possible to employ a method of evaporating water component as a decompression or an etch-back method based on a plasma etching method and the like.

[Process-120]

Figure 1C:
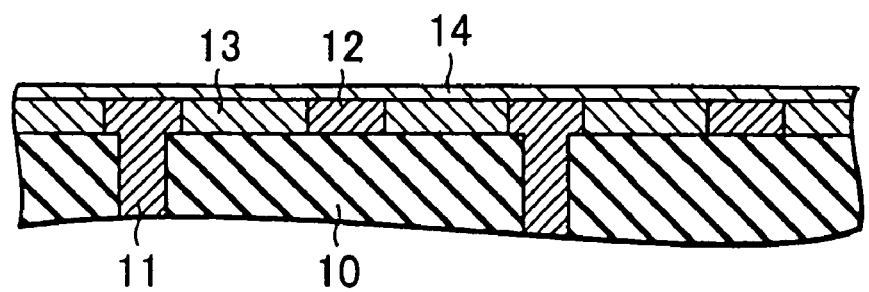

After that, a gas permeable film 14 is formed on the wiring 12 and the filling layer 13. Actually, the gas permeable film 14 having a thickness of 0.2 to 0.5 µm, which is composed of $SiO_2$, is formed by using a cooled plasma CVD method (a temperature of a semiconductor substrate of −110° C.) using $SiH_4/O_2$ diluted with hydrogen gas as raw material gas, at a low temperature of 0° C. or less. Accordingly, the structure as shown in FIG. 1C can be obtained. By the way, this cooled plasma CVD method is noted in a preliminary document of the Digest of the 38-th Annual Meeting of Related Association of the Japan Society of Applied Physics, No. 2, page 633, 29p-v-11.

Or, the gas permeable film 14 can be also made of an insulation material having a low dielectric constant. In this case, for example, xerogel film of a silicon oxide system (this is made by Allied Signal Corporation, and a product name is Nanoglass, and κ=2.0) is coated at a thickness of about 1.0 µm on the entire surface by using the spin coating method, and cured at about 400° C. Or, the solidification reaction based on dehydration condensation reaction in water solution containing tetra-ethoxy-silane (TEOS) and ammonium ($NH_3$) is used to form the porous structure having a solid coupling. After that, the water solution is dried.

[Process-130]

Figure 2A:
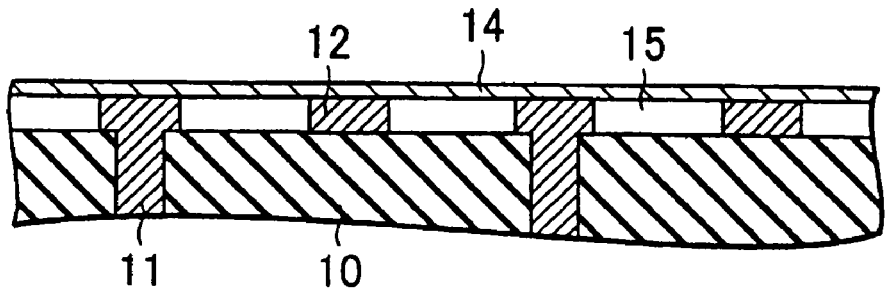

Next, the filling layer 13 is removed through the gas permeable film 14. Accordingly, a gap 15 is formed between the wirings 12. Actually, if the semiconductor substrate is heated to 100 to 300° C. or it is decompressed so as to evaporate the ice constituting the filling layer 13 existing between the wirings 12, vapor is exhausted outside the system through the gas permeable film 14. Accordingly, the gap 15 is formed between the wirings 12. Thus, the structure as shown in FIG. 2A can be obtained. After that, by setting it at the vacuum (decompressed) state of about $10^2$ Pa, it is desired to sufficiently remove the vapor within the gap 15 surrounded by the insulation layer 10, the wiring 12 and the gas permeable film 14.

[Process-140]

Figure 2B:
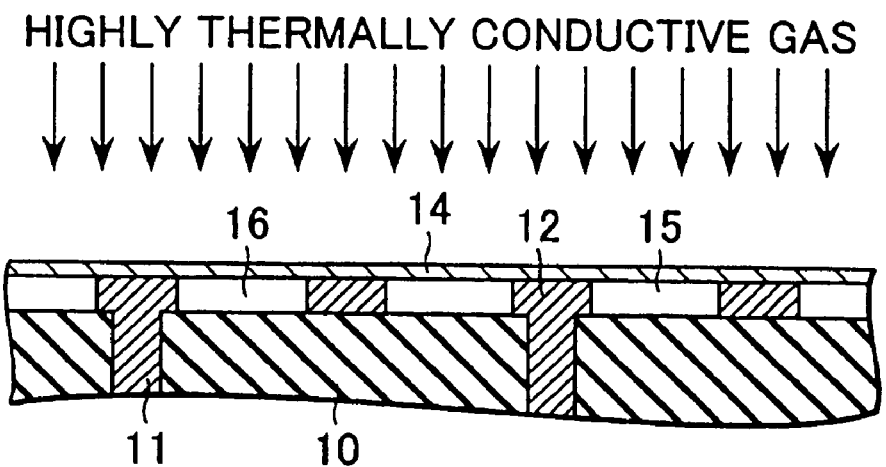

After that, a chamber for heating/decompressing/filling is set at 100° C., $1.0 \times 10^5$ Pa to $1.5 \times 10^5$ Pa and helium gas atmosphere. Thus, the helium gas that is the highly thermally conductive gas can be filled through the gas permeable film 14 into the gap 15. This situation is shown in FIG. 2B, and the helium gas is denoted by a reference number 16.

[Process-150]

Figure 2C:
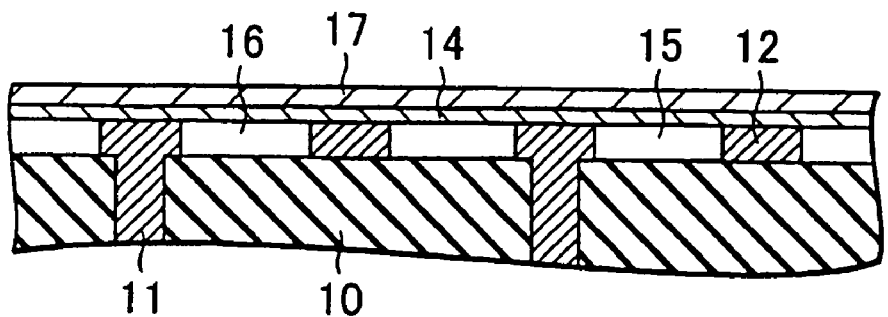

Next, a gas impermeable film 17 is formed on the gas permeable film 14. Actually, silicon nitride (SiN) film having a thickness of 0.1 µm to 0.2 µm is formed on the entire surface by using a plasma CVD method that uses $SiH_4$ and $NH_3$ as a raw material gas. Accordingly, the structure as shown in FIG. 2C can be obtained. Incidentally, [Process-140] and [Process-150], or [Process-130] to [Process-150] may be carried out within the CVD apparatus.

In this way, the gap 15 is formed between the wirings 12 formed on the insulation layer 10 corresponding to the substrate. Thus, the semiconductor device in the first embodiment can be obtained in which the gap 15 is filled with a helium gas 16 that is gas having a thermal conductivity equal to or higher than three times that of air at 0° C.

By the way, in the first embodiment, the filling layer 13 can be made of a resist material or carbon, instead of the operation in which the filling layer 13 is made of the ice. In this case, at [Process-130], in the condition that the semiconductor substrate is kept at a temperature of 100° C. or more, the gas permeable film 14 may be exposed in oxygen or oxygen plasma atmosphere. The oxygen is passed through the gas permeable film 14, and reacted with the resist material or the carbon constituting the filling layer 13. Then, CO gas or $CO_2$ gas is generated, and such CO gas or $CO_2$ gas is exhausted outside the system through the gas permeable film 14. Accordingly, the gap 15 is formed between the wirings 12. Or, at [Process-130], for example, the semiconductor substrate is immersed in acetone solution. Thus, the resist material is dissolved in the acetone solution, and exhausted outside the system through the gas permeable film 14. Accordingly, the gap 15 is formed between the wirings 12. Or, at [Process-130], the resist material or the carbon is baked. Then, CO gas or $CO_2$ gas is generated, and such CO gas or $CO_2$ gas is exhausted outside the system through the gas permeable film 14. Accordingly, the gap 15 is formed between the wirings 12. In the above-mentioned operations, after the formation of the gap 15 between the wirings 12, by setting at the vacuum (decompressed) state, it is desired to sufficiently remove the gaseous substance within the gap 15 surrounded with the insulation layer 10, the wiring 12 and the gas permeable film 14.

Also, if a distance between the wirings 12 is long, for example, about 5 µm or more, a dummy wiring is desired to be placed between the wirings 12.

(Second Embodiment)

A second embodiment is a modification of the first embodiment. A semiconductor device in the second embodiment has a construction in which the wiring structure described in the first embodiment is laminated. A wiring forming method in the semiconductor device in the second embodiment will be described below with reference to FIGS. 3A, 3B.

[Process-200]

Figure 3A:
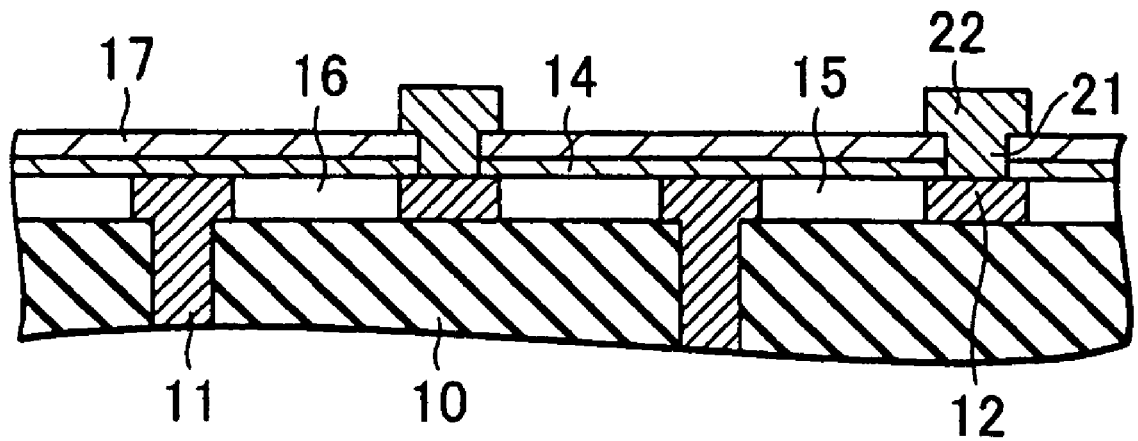

At first, the processes are carried out which are similar to [Process-100] to [Process-150] in the first embodiment. After that, the lithography technique and the dry etching technique are used to form the openings on the gas permeable film 14 and the gas impermeable film 17 above the wiring 12. Next, for example, the sputtering technique and the dry etching technique are used to fill the opening with wiring material (for example, aluminum alloy). Then, a contact plug 21 is formed within the opening. Also, a wiring 22 is formed on the gas impermeable film 17. Accordingly, the structure as shown in FIG. 3A can be obtained.

[Process-210]

Figure 3B:
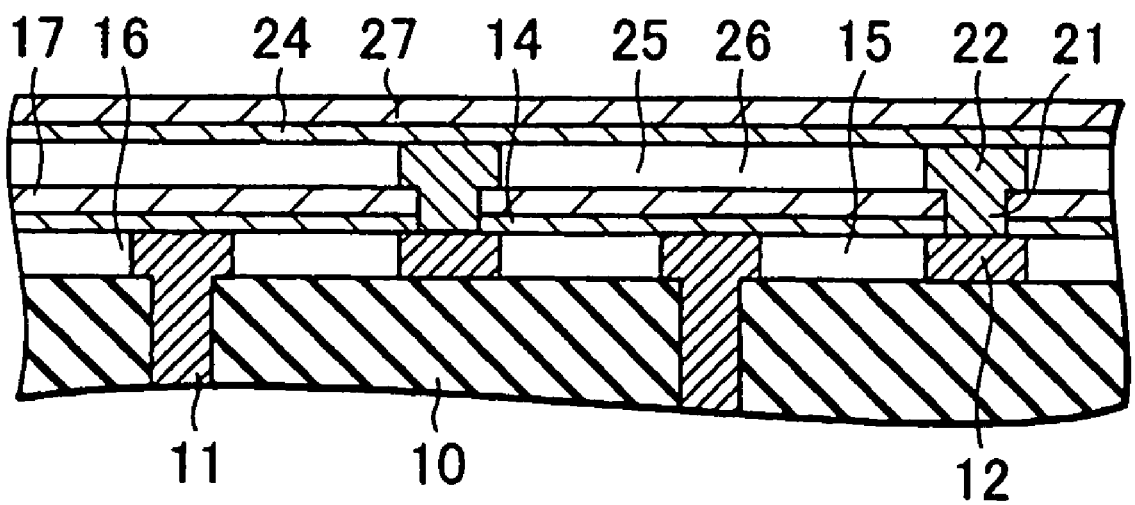

Next, [Process-110] to [Process-150] of the first embodiment are carried out. Accordingly, as shown in FIG. 3B, a gap 25 is formed between the wirings 22 formed on the gas impermeable film 17 corresponding to the substrate. Thus, it is possible to obtain the semiconductor device in the second embodiment in which the gap 25 is filled with a helium gas 26 that is gas having a thermal conductivity equal to or higher than three times that of the air at 0° C. By the way, reference numbers 24, 27 denote the gas permeable film and the gas impermeable film, respectively.

The further repetition of [Process-200] and [Process-210] can attain the semiconductor device having a construction in which the wiring structure having a desired number of layers is laminated.

By the way, in the second embodiment, [Process-140] and [Process-150] may be substitutionally carried out after [Process-110] to [Process-130] are repeated for a desired number of times, after the execution of the process similar to [Process-100] in the first embodiment. Alternatively, [Process-130] to [Process-150] may be substitutionally carried out after [Process-110] and [Process-120] are repeated for a desired number of times, after carrying out the process similar to [Process-100] in the first embodiment.

(Third Embodiment)

A third embodiment is also a modification of the first embodiment. In the semiconductor device in the third embodiment, a wiring has a multiple-layer structure. That is, it has a structure in which a wiring is formed through a plug made of a wiring material on a wiring (a two-layer wiring structure), and a gap exists between those multiple-layer structures. A wiring forming method in the semiconductor device in the second embodiment will be described below with reference to FIGS. 4A to 5C.

[Process-300]

At first, the process is carried out similar to [Process-100] in the first embodiment.

[Process-310]

Figure 4A:
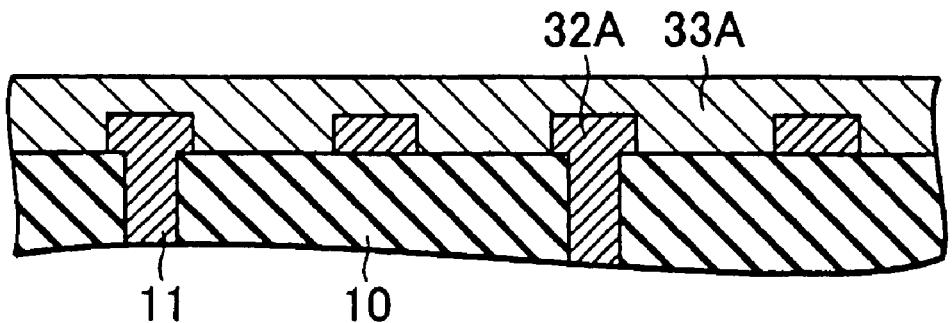

After that, after a filling layer 33A made of a material having a low dielectric constant is formed on the entire surface, a flattening process is performed on the filling layer 33A. This situation is shown in FIG. 4A. After that, the lithography technique and the dry etching technique are used to form openings in the filling layer 33A above a wiring 32A.

Figure 4B:
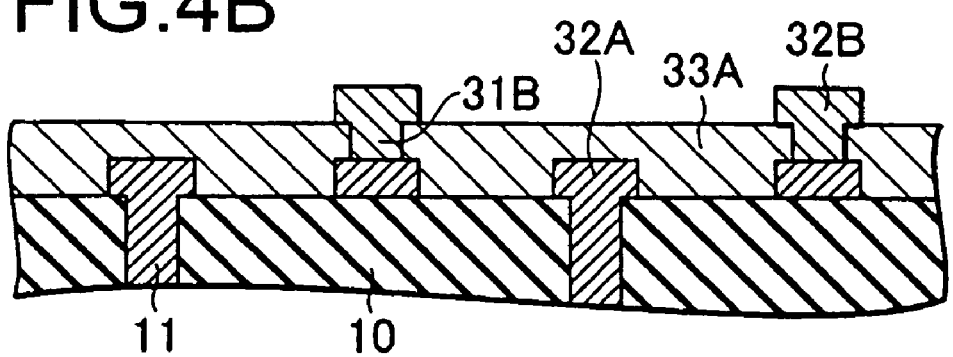
Figure 4C:
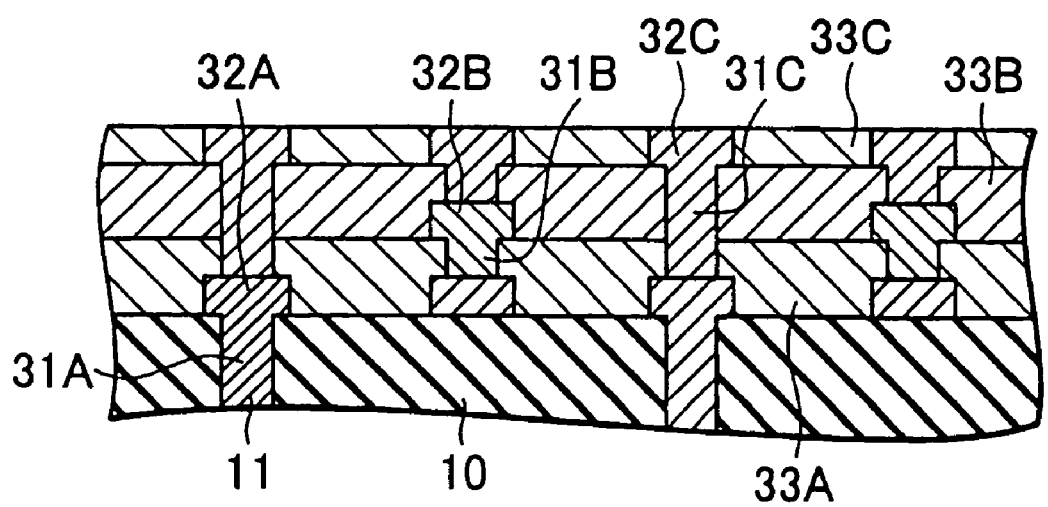

Next, for example, the sputtering technique and the dry etching technique are used to fill the opening with the wiring material (for example, the aluminum alloy). Then, a contact plug 31B is formed within the opening. Also, a wiring 32B is formed on the filling layer 33A. Accordingly, the structure as shown in FIG. 4B can be obtained. This process is repeated for a desired number of times. Accordingly, the structure as shown in FIG. 4C can be obtained. By the way, in the example shown in FIG. 4C, [Process-310] is repeated twice, and a three-layer wiring is totally formed.

[Process-320]

Figure 5A:
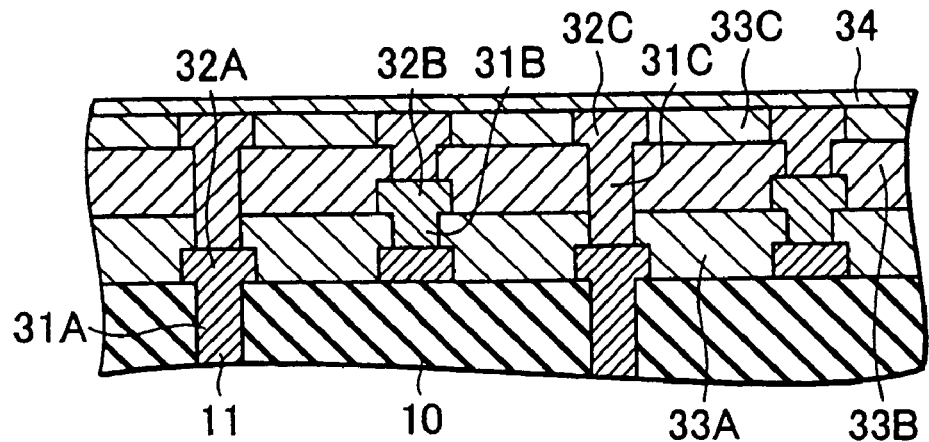
Figure 5B:
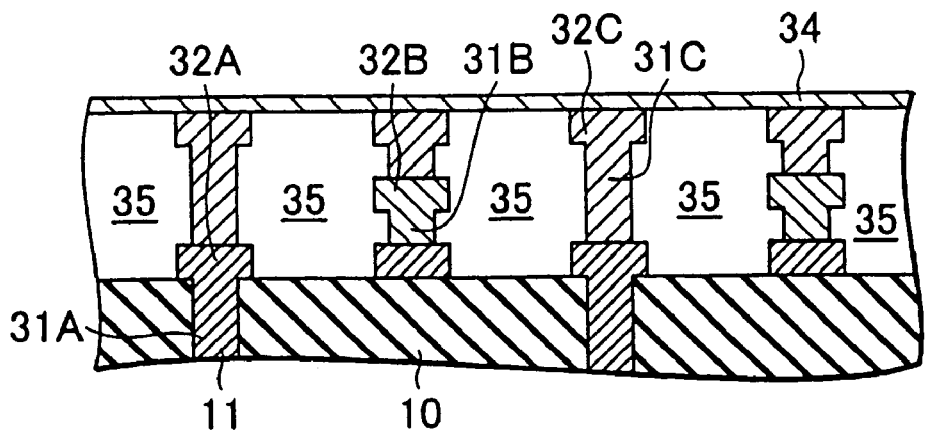
Figure 5C:
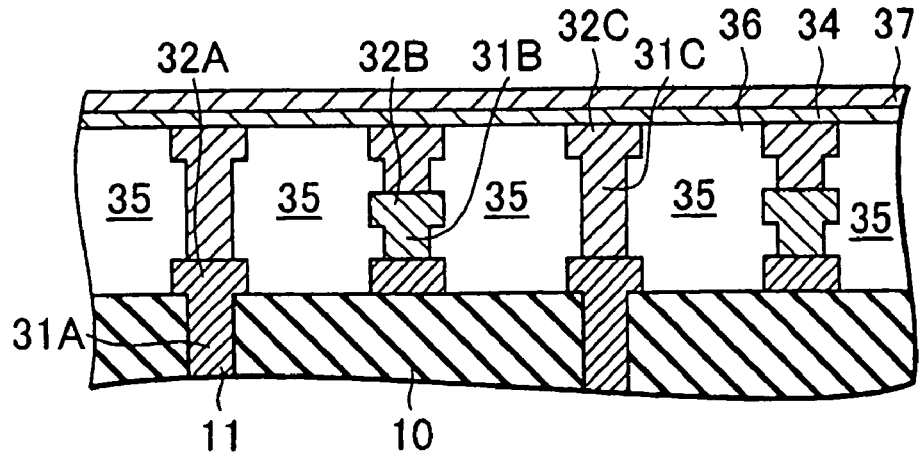

Next, similarly to [Process-120] in the first embodiment, a gas permeable film 34 is formed on a wiring 32C and a filling layer 33C (refer to FIG. 5A). Then, similarly to [Process-130], the filling layers 33A, 33B and 33C are removed through the gas permeable film 34. Accordingly, gaps 35 are formed between the wirings 32A, 32B and 32C (refer to FIG. 5B). After that, similarly to [Process-140], a helium gas 36 can be filled through the gas permeable film 34 into the gap 35. Next, similarly to [Process-150], a gas impermeable film 37 is formed on the gas permeable film 34. Accordingly, it is possible to obtain the semiconductor device in the third embodiment having the multiple-layer wiring structure shown in FIG. 5C.

(Fourth Embodiment)

A fourth embodiment relates to a semiconductor device of the present invention, and a wiring forming method in the semiconductor device according to the second embodiment of the present invention. In the fourth embodiment, the helium gas is used as the highly thermally conductive gas. Also, the substrate is the insulation layer formed on the silicon semiconductor substrate on which the transistor device such as the MOS type FET and the like are formed. Gas no-transmission film is made of polyimide film. The semiconductor device and the wiring forming method in the fourth embodiment will be described below with reference to FIGS. 6A, 6B of the partially sectional views diagrammatically showing the insulation layer and the like.

[Process-400]

Figure 6A:
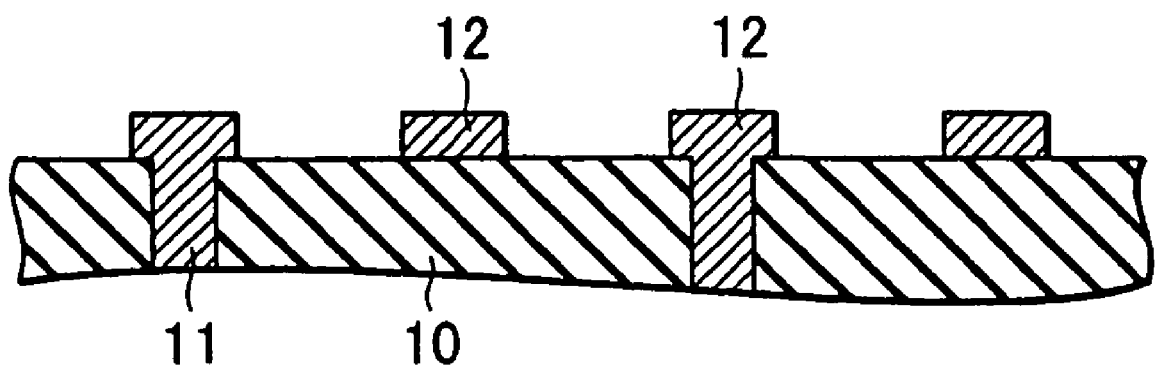

At first, the process similar to [Process-100] in the first embodiment is carried out. That is, the known transistor element (for example, the MOS type FET) is formed on the semiconductor substrate. Then, the CVD method is used to form the base insulation layer 10 on the entire surface. After that, the lithography technique and the dry etching technique are used to form the openings on the base insulation layer 10. Then, for example, the sputtering technique and the dry etching technique are used to fill the wiring material (for example, the aluminum alloy) into the opening. The contact plug 11 is formed in the opening. Also, the wiring 12 is formed on the base insulation layer 10 corresponding to the substrate. Accordingly, the structure as shown in FIG. 6A can be obtained.

[Process-410]

Figure 6B:
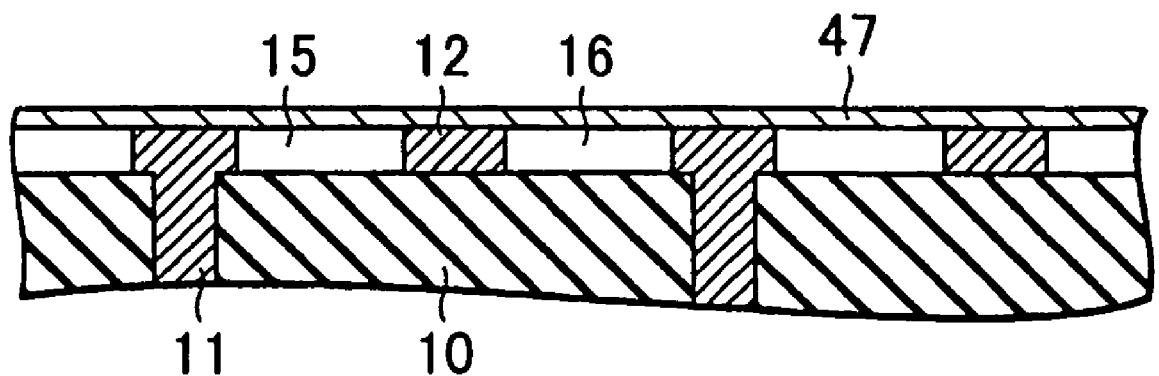

After that, the semiconductor substrate is inserted into a vacuum filling processing apparatus. Once the vacuum filling processing apparatus is set at the state of the vacuum (decompression) atmosphere, it is set at the state of the gas atmosphere having a thermal conductivity equal to or higher than three times that of the air at 0° C. (in the fourth embodiment, helium gas atmosphere at a temperature of 100° C. and a pressure of $1.0 \times 10^5$ Pa to $1.5 \times 10^5$ Pa). Then, at this state, a gas impermeable film 47 is formed on the wiring 12 and above the gap 15 existing between the wirings 12. Actually, a roll of a polyimide film having a thickness of 1 μm is placed in advance within the vacuum filling processing apparatus. Then, the polyimide film is pulled out from the roll, and placed on the wiring 12. After that, a heat treatment is carried out at a situation that a pressure is applied to the polyimide film, or polyimide adhesive is used to carry out the heat treatment. Or, after adhesive polyimide film is placed on the wiring 12, the heat treatment is done at the situation that the pressure is applied to such polyimide film. Accordingly, the gas impermeable film 47 can be formed above the gap 15 existing between the wirings 12. Thus, as shown in FIG. 6B, the gap 15 is formed between the wirings 12 formed on the base insulation layer 10 corresponding to the substrate. Hence, it is possible to obtain the semiconductor device in the fourth embodiment in which the gap 15 is filled with the helium gas 16 that is the highly thermally conductive gas having the thermal conductivity equal to or higher than three times that of the air at 0° C.

By the way, if a distance between the wirings 12 is long, for example, about 5 μm, a dummy wiring is desired to be placed between the wirings 12.

Also, the construction having the two-layer wiring structure in which the gaps exist between the multiple-layer wiring structures can be obtained if the following processes are carried out. That is, after [Process-410], the openings are formed in the gas impermeable film 47 made of the polyimide film above the wiring 12. Next, for example, the sputtering technique and the dry etching technique are used to fill the opening with the wiring material (for example, the aluminum alloy), and the contact plug is formed in the opening, and the wiring is also formed on the gas impermeable film 47 corresponding to the substrate. After that, [Process-410] is carried out. If those processes are repeated for a desired number of times, it is possible to obtain the configuration having the multiple-layer wiring structure of three layers or more, in which the gaps exist between these multiple-layer wiring structures.

Alternatively, [Process-400] is carried out. After that, an interlayer insulation layer is formed on the entire surface. Next, after the formation of the openings on the interlayer insulation layer above the wiring, for example, the sputtering technique and the dry etching technique are used to fill the opening with the wiring material (for example, the aluminum alloy), and the contact plug is formed in the opening. Also, after the formation of the wiring on the interlayer insulation layer, such wiring is used as an etching mask, and the dry etching is performed on the interlayer insulation layer. Or, the interlayer insulation layer is perfectly removed. That is, the filling layer is removed after carrying out the processes similar to [Process-300] and [Process-310] in the third embodiment. Accordingly, it is possible to obtain the two-layer wiring structure. Or, after those processes are repeated for a desired number of times, the dry etching is performed on the interlayer insulation layer, or the interlayer insulation layer is perfectly removed. Accordingly, it is possible to obtain the multiple-layer wiring structure. In this way, after obtaining the two-layer wiring structure or the multiple-layer wiring structure, by executing [Process-410], it is possible to obtain the semiconductor device in the fourth embodiment having the two-layer wiring structure or the multiple-layer wiring structure.

(Fifth Embodiment)

A fifth embodiment relates to a semiconductor device of the present invention, and a wiring forming method in the semiconductor device according to the third embodiment of the present invention. In the fifth embodiment, the helium gas is used as the highly thermally conductive gas. Also, the substrate is the insulation layer formed on the silicon semiconductor substrate on which the transistor device such as the MOS type FET and the like are formed. It is made of film on which a material having a low dielectric constant is coated with gas permeable film as base. The semiconductor device and the wiring forming method in the fifth embodiment will be described below with reference to FIGS. 7A, 7B and 7C of the partially sectional views diagrammatically showing an insulation layer and the like.

[Process-500]

Figure 7A:
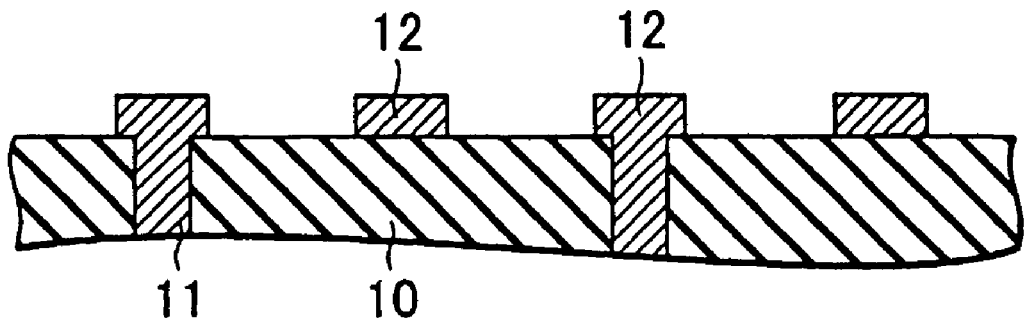

At first, the process similar to [Process-100] in the first embodiment is carried out. That is, the known transistor device (for example, the MOS type FET) is formed on the semiconductor substrate. Then, the base insulation layer 10 is formed on the entire surface by using the CVD method. After that, the lithography technique and the dry etching technique are used to form the openings on the base insulation layer 10. Then, for example, the sputtering technique and the dry etching technique are used to fill the wiring material (for example, the aluminum alloy) into the opening. The contact plug 11 is formed in the opening. Also, the wiring 12 is formed on the base insulation layer 10 corresponding to the substrate. Accordingly, the structure as shown in FIG. 7A can be obtained.

[Process-510]

Figure 7B:
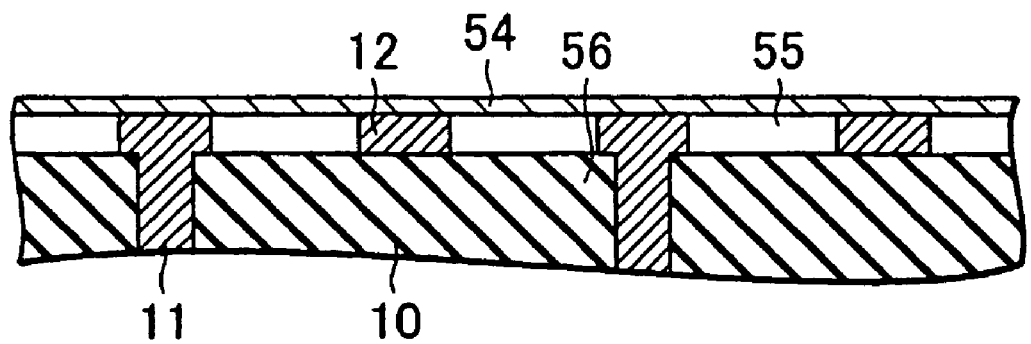

After that, a gas permeable film 54 is formed on the wiring 12 and above the gap existing between the wirings 12. Actually, a roll of the film on which a material having a low dielectric constant is coated is placed in advance on a base having a thickness of 0.5 μm. Then, the film is pulled out from the roll, and it is placed on the wiring 12. After that, a heat treatment is carried out at a situation that a pressure is applied to this film, or proper adhesive is used to carry out the heat treatment. Accordingly, the gas permeable film 54 can be formed on the wiring 12 and above a gap 55 existing between the wirings 12. Thus, as shown in FIG. 7B, the gap 55 is formed between the wirings 12 formed on the base insulation layer 10 corresponding to the substrate.

[Process-520]

Figure 7C:
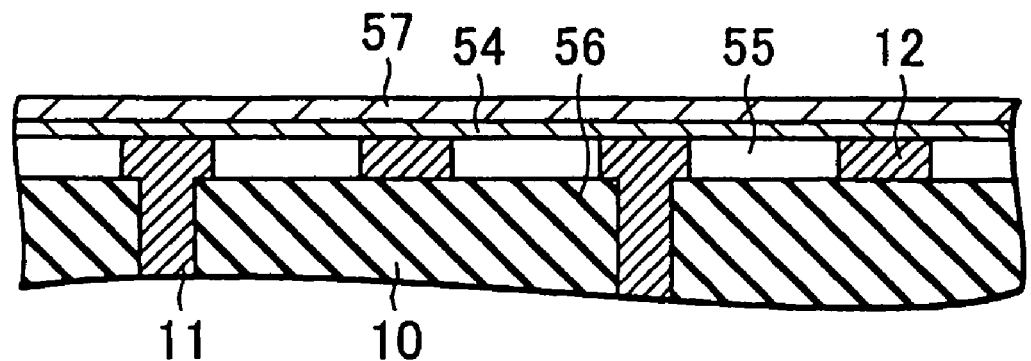

Next, the semiconductor substrate is inserted into a CVD apparatus. Once the CVD apparatus is set at the state of the vacuum (decompression) atmosphere, it is set at the state of the gas atmosphere having the thermal conductivity equal to or higher than three times that of the air at 0° C. (in the fifth embodiment, the helium gas atmosphere at the temperature of 100° C. and the pressure of $1.0 \times 10^5$ Pa to $1.5 \times 10^5$ Pa). Thus, the helium gas that is the highly thermally conductive gas is filled into the gap 55. After that, a gas impermeable film 57 is formed on the wiring 12 and above the gap 55 existing between the wirings 12. Actually, similarly to [Process-150] in the first embodiment, silicon nitride (SiN) film is formed on the gas permeable film 54 by using the plasma CVD method. Thus, the structure as shown in FIG. 7C can be obtained. Incidentally, similarly to [Process-410] in the fourth embodiment, the gas impermeable film 57 made of polyimide film may be laminated on the gas permeable film 54.

In this way, the gap 55 is formed between the wirings 12 formed on the insulation layer 10 corresponding to the substrate. Hence, it is possible to obtain the semiconductor device in the fifth embodiment in which the gap 55 is filled with the helium gas 56 that is the highly thermally conductive gas having the thermal conductivity equal to or higher than three times that of the air at 0° C.

By the way, if the distance between the wirings 12 is long, such as, for example, about 5 μm, the dummy wiring is desired to be placed between the wirings 12.

Also, the construction having the two-layer wiring structure in which the gaps exist between the multiple-layer wiring structures can be obtained if the following processes are carried out. That is, after [Process-520], the openings are formed in the gas impermeable film 57 and the gas permeable film 54 above the wiring 12. Next, for example, the sputtering technique and the dry etching technique are used to fill the opening with the wiring material (for example, the aluminum alloy), and the contact plug is formed in the opening, and the wiring is also formed on the gas impermeable film 57 corresponding to the substrate. After that, [Process-510] and [Process-520] are carried out. If those processes are repeated for a desired number of times, it is possible to obtain the construction having the multiple-layer wiring structure of three layers or more, in which the gaps exist between the multiple-layer wiring structures.

Alternatively, the construction having the two-layer wiring structure in which the gaps exist between the multiple-layer wiring structures can be obtained if the following processes are carried out. That is, after [Process-510], the openings are formed in the gas permeable film 54 above the wiring 12. Next, for example, the sputtering technique and the dry etching technique are used to fill the opening with the wiring material (for example, the aluminum alloy), and the contact plug is formed in the opening, and the wiring is also formed on the gas permeable film 54 corresponding to the substrate. After that, [Process-520] is carried out. Also, if [Process-520] is carried out after the processes before the execution of [Process-520] is repeated for a desired number of times, it is possible to obtain the configuration having the multiple-layer wiring structure of three layers or more, in which the gaps exist between the multiple-layer wiring structures.

Alternatively, [Process-500] is carried out. After that, the interlayer insulation layer is formed on the entire surface. Next, after the formation of the openings on the interlayer insulation layer above the wiring, for example, the sputtering technique and the dry etching technique are used to fill the opening with the wiring material (for example, the aluminum alloy), and the contact plug is formed in the opening. Also, after the formation of the wiring on the interlayer insulation layer, such wiring is used as the etching mask, and the dry etching is performed on the interlayer insulation layer. Or, the interlayer insulation layer is perfectly removed. That is, the filling layer is removed after the execution of the processes similar to [Process-300] and [Process-310] in the third embodiment. Accordingly, it is possible to obtain the two-layer wiring structure. Or, after those processes are repeated for a desired number of times, the dry etching is performed on the interlayer insulation layer, or the interlayer insulation layer is perfectly removed. Accordingly, it is possible to obtain the multiple-layer wiring structure. In this way, after the obtainment of the two-layer wiring structure or the multiple-layer wiring structure, by executing [Process-510] and [Process-520], it is possible to obtain the semiconductor device in the fifth embodiment having the two-layer wiring structure or the multiple-layer wiring structure.

Figure 8A:
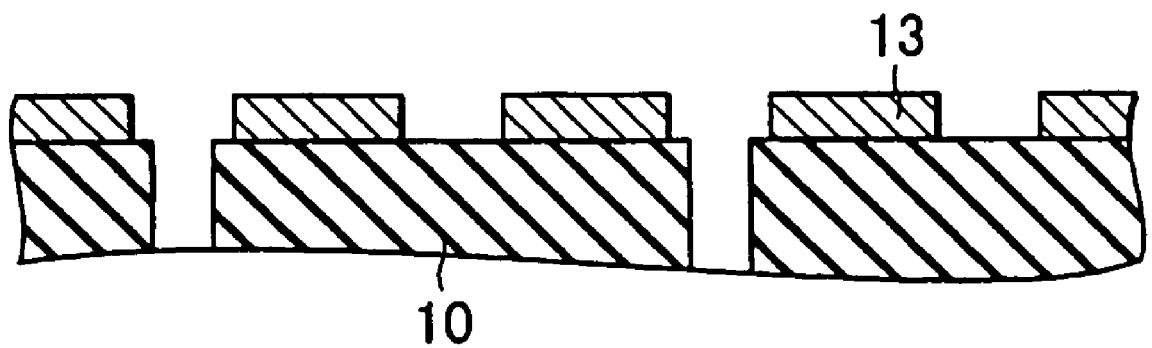
FIGS. 8A, 8B are partially sectional views diagrammatically showing a base insulation layer and the like to describe a process for forming a wiring and a filling layer by using a so-called damascene method.
Figure 8B:
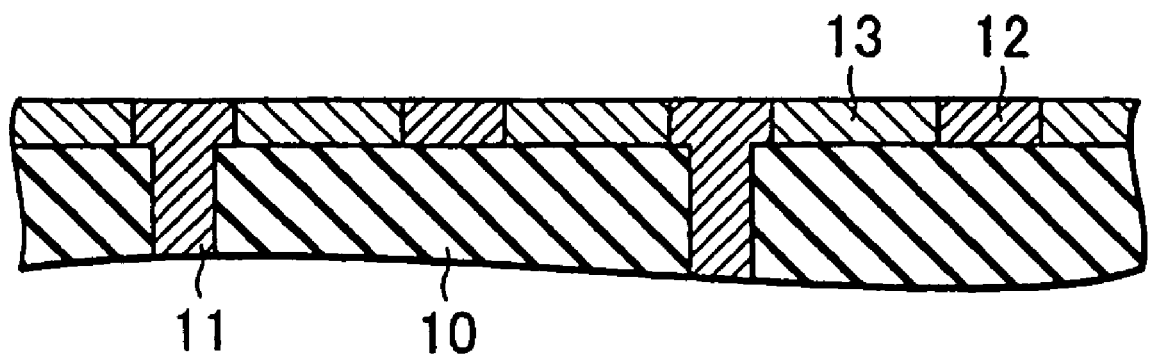
Figure 9A:
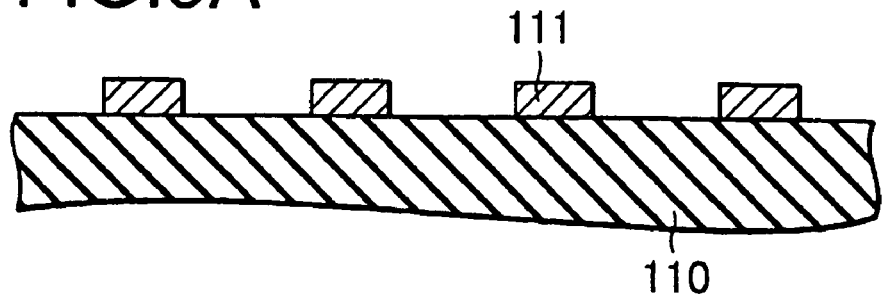
Figure 9B:
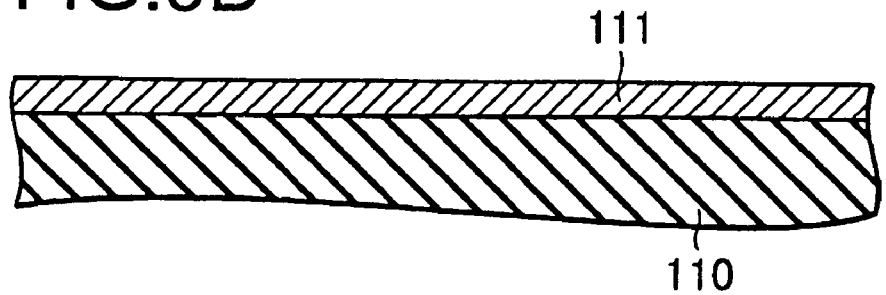
Figure 9C:
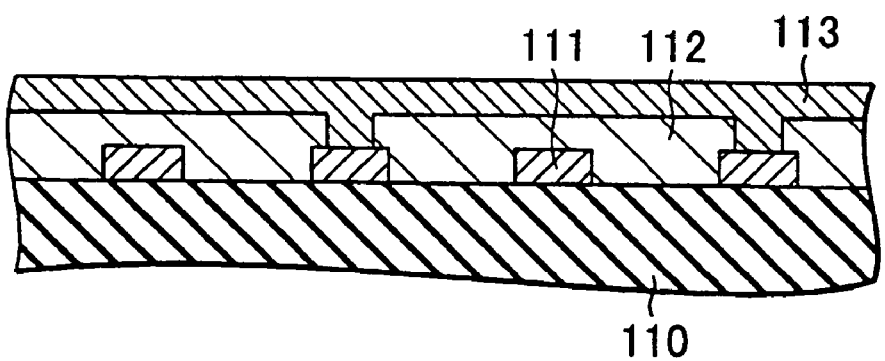
Figure 9D:
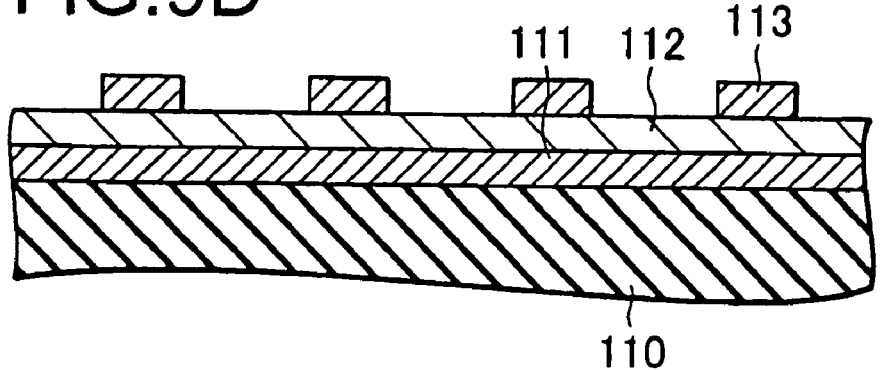
Figure 10A:
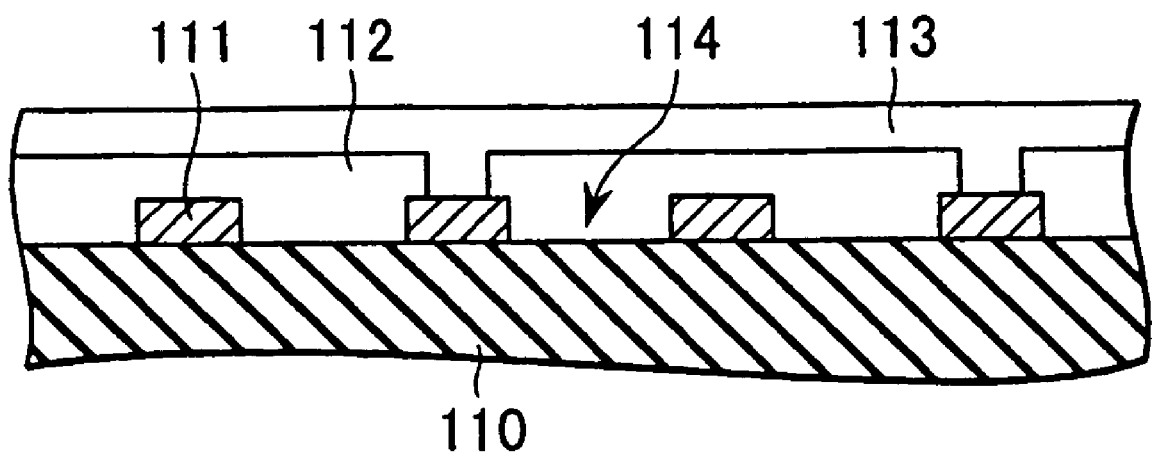
Figure 10B:
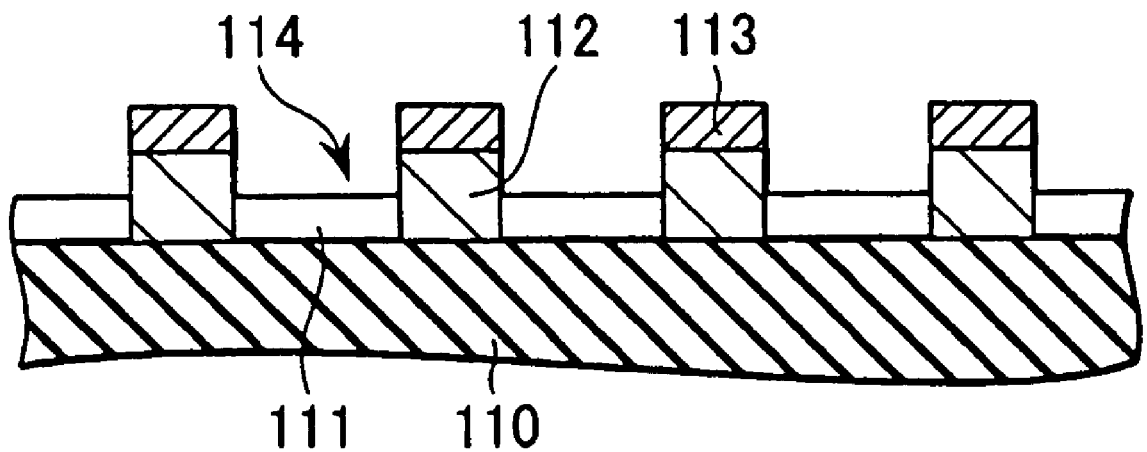

As mentioned above, the present invention has been described on the basis of the embodiments of the present invention. However, the present invention is not limited to them. In the first to third embodiments, the filling layer is formed after the formation of the wiring on the base insulation layer and the like. However, the so-called damascene method such as the single damascene method or the dual damascene method can be used to form the wiring and the filling layer. That is, as indicated in the partial end views of FIGS. 8A, 8B diagrammatically showing the base insulation layer and the like, after the formation of the filling layer 13 on the base insulation layer 10, a concave portion (actually, a groove or the combination of the groove and the opening) is formed on the filling layer 13 (refer to FIG. 8A). Next, for example, a plating method is used to form a wiring material layer on the entire surface. Then, the wiring material layer on the filling layer 13 is selectively removed by a CMP method and an etchback method. Accordingly, the filling layer 13 filled between the wirings 12 can be formed on the substrate. Moreover, such a damascene method can be applied to the formation of the wiring in another embodiment of the present invention.

What is claimed is:

1. A wiring forming method in a semiconductor device, the method comprising the steps of:
    (A) forming a wiring and a filling layer filled between wirings, on a substrate;
    (B) forming a gas permeable film on the wiring and the filling layer, said gas permeable film being made of silicon nitride;
    (C) removing the filling layer through the gas permeable film so as to form a gap between the wirings;
    (D) filling the gap with a gas having a thermal conductivity equal to or higher than three times that of air at 0° C. through the gas permeable film into the gap; and
    (E) forming a gas impermeable film on the gas permeable film, wherein, the filling layer comprises:
    a non-fluorine system polymer selected from the group consisting of BCB, poly-aryl-ether, polyimide, and like effective non-fluorine system polymers, a fluorine system polymer selected from the group consisting of a fluorine addition polymer, tetra-fluoro ethylene, cyclo-perfluoro carbon, poly-aryl-fluoride ether, fluorine addition parylene, and like effective flourine system polymers, organic SOG, silicon oxide system xerogel, nano-porous silica, or amorphous carbon.

2. A wiring forming method in a semiconductor device, the method comprising the steps of:
    (A) forming a plurality of wirings on a substrate with a filling layer between said wirings;
    (B) forming a gas permeable film on the wiring and the filling layer, said gas permeable film being made of a polyimide film;
    (C) removing the filling layer through the gas permeable film so as to form a gap; and
    (D) forming a gas impermeable film on the wirings and above gaps existing between the wirings, in a gas atmosphere having a thermal conductivity equal to or higher than three times that of air at 0° C.; wherein,
    the filling layer comprises:
    a non-fluorine system polymer selected from the group consisting of BCB, poly-aryl-ether, polyimide, and like effective non-fluorine system polymers, a fluorine system polymer selected from the group consisting of a fluorine addition polymer, tetra-fluoro ethylene, cyclo-perfluoro carbon, poly-aryl-fluoride ether, fluorine addition parylene, and like effective flourine system polymers, organic SOG, silicon oxide system xerogel, nano-porous silica, or amorphous carbon.

3. A wiring forming method in a semiconductor device, the method comprising the steps of:

(A) forming a plurality of wirings on a substrate with a filling layer between the wirings;
(B) forming a gas permeable film on the wirings and above gaps existing between the wirings, said gas permeable film being made of one of silicon oxide film and a low dielectric constant film;
(C) filling a gas having a thermal conductivity equal to or higher than three times that of air at 0° C. through the gas permeable films into the gaps; and
(D) forming a gas impermeable film made of silicon nitride on the gas permeable film, wherein, the filling layer comprises:

a non-fluorine system polymer selected from the group consisting of BCB, poly-aryl-ether, polyimide, and like effective non-fluorine system polymers, a fluorine system polymer selected from the group consisting of a fluorine addition polymer, tetra-fluoro ethylene, cyclo-perfluoro carbon, poly-aryl-fluoride ether, fluorine addition parylene, and like effective flourine system polymers, organic SOG, silicon oxide system xerogel, nano-porous silica, or amorphous carbon.

* * * * *